United States Patent
Godard et al.

(10) Patent No.: US 12,194,751 B2
(45) Date of Patent: *Jan. 14, 2025

(54) INKJET PRINTING PROCESS

(71) Applicant: LUXEMBOURG INSTITUTE OF SCIENCE AND TECHNOLOGY (LIST), Esch-sur-Alzette (LU)

(72) Inventors: Nicolas Godard, Musson (BE); Daniele Sette, Grenoble (FR); Sebastjan Glinsek, Dudelange (LU); Emmanuel Defay, Esch-sur-Alzette (LU)

(73) Assignee: LUXEMBOURG INSTITUTE OF SCIENCE AND TECHNOLOGY (LIST), Esch-Alzette (LU)

( * ) Notice: Subject to any disclaimer, the term of this patent is extended or adjusted under 35 U.S.C. 154(b) by 759 days.

This patent is subject to a terminal disclaimer.

(21) Appl. No.: 17/288,052

(22) PCT Filed: Oct. 24, 2019

(86) PCT No.: PCT/EP2019/079049
§ 371 (c)(1),
(2) Date: Apr. 23, 2021

(87) PCT Pub. No.: WO2020/084066
PCT Pub. Date: Apr. 30, 2020

(65) Prior Publication Data
US 2021/0379898 A1    Dec. 9, 2021

(30) Foreign Application Priority Data

Oct. 25, 2018  (LU) .................................. 100971

(51) Int. Cl.
*B41J 2/175*     (2006.01)
*B41J 2/21*      (2006.01)
*B81C 1/00*      (2006.01)
*C09D 11/36*     (2014.01)

(52) U.S. Cl.
CPC ......... *B41J 2/17503* (2013.01); *B41J 2/2107* (2013.01); *C09D 11/36* (2013.01); *B81C 1/00373* (2013.01); *B81C 2201/0185* (2013.01)

(58) Field of Classification Search
CPC ... B41J 2/01; B41J 2/211; B41J 2/1433; B41J 2/17; B41J 2/17593; B41J 2/2107; B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; B41M 5/0011; B41M 5/0017; B41M 5/0023; B41M 5/0047; B41M 7/00; B41M 7/0072; B41M 5/52; B41M 5/5218; B41M 5/5227; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; C09D 11/106
See application file for complete search history.

(56) References Cited

U.S. PATENT DOCUMENTS

| | | | |
|---|---|---|---|
| 11,299,646 B2* | 4/2022 | Godard | B41M 5/0023 |
| 2009/0133169 A1* | 5/2009 | Mirkin | B01L 3/0255 |
| | | | 850/55 |
| 2009/0215208 A1* | 8/2009 | Coe-Sullivan | H01L 21/0271 |
| | | | 977/734 |
| 2009/0252924 A1* | 10/2009 | Kamikoriyama | C09D 11/52 |
| | | | 428/141 |

(Continued)

FOREIGN PATENT DOCUMENTS

| | | |
|---|---|---|
| CN | 101077954 B | 5/2010 |
| JP | 2013235902 A | 11/2013 |

(Continued)

OTHER PUBLICATIONS

International Search Report for PCT/EP2019/079049 mailed Jan. 28, 2020.
Written Opinion for PCT/EP2019/079049 mailed Jan. 28, 2020.

*Primary Examiner* — Manish S Shah
(74) *Attorney, Agent, or Firm* — Sandberg Phoenix & von Gontard, P.C.

(57) ABSTRACT

An only inkjet-printing-based process for depositing functional materials, in various instances PZT, Bi-based material or (K,Na)-based material, on a substrate, in various instances platinized silicon. Substrate templating (via SAMs) and material deposition are both performed by an inkjet printing process. Additionally, a composition to be used as a SAM precursor ink which is a thiol in a solvent mixture. Further, a cartridge for a printing machine with such a composition. Still further, the use of such a cartridge, alone, or as a kit with another cartridge containing a precursor of the functional material, in particular to perform both steps of the printing method. Finally, a product, for instance a microsystem, obtained by the process.

12 Claims, 3 Drawing Sheets

(56) References Cited

U.S. PATENT DOCUMENTS

| | | | |
|---|---|---|---|
| 2010/0034986 A1* | 2/2010 | Kodas | H05K 3/105 |
| | | | 427/596 |
| 2010/0258968 A1* | 10/2010 | Zu | C09D 11/03 |
| | | | 264/134 |
| 2011/0135823 A1* | 6/2011 | Lee | C09D 11/00 |
| | | | 427/256 |
| 2012/0206544 A1 | 8/2012 | Machida et al. | |
| 2013/0153829 A1* | 6/2013 | Kondo | H01B 1/22 |
| | | | 977/762 |
| 2013/0194350 A1 | 8/2013 | Watanabe et al. | |
| 2014/0066291 A1* | 3/2014 | Marshall | B01J 27/045 |
| | | | 502/168 |
| 2014/0340854 A1* | 11/2014 | Akiyama | H01L 28/40 |
| | | | 427/126.3 |
| 2014/0354745 A1* | 12/2014 | Miyamoto | B41J 11/0015 |
| | | | 347/102 |
| 2015/0045515 A1* | 2/2015 | Li | A61L 29/06 |
| | | | 525/291 |
| 2015/0290938 A1* | 10/2015 | Rogers | B41J 2/06 |
| | | | 347/55 |
| 2017/0130085 A1 | 5/2017 | Kondo | |

FOREIGN PATENT DOCUMENTS

| | | |
|---|---|---|
| JP | 2015233030 A | 12/2015 |
| WO | 2009/085678 A1 | 7/2009 |
| WO | 2018/202576 A1 | 11/2018 |

* cited by examiner

INKJET PRINTING PROCESS

CROSS-REFERENCE TO RELATED APPLICATIONS

The present invention is the US national stage under 35 U.S.C. § 371 of International Application No. PCT/EP2019/079049 which was filed on Oct. 24, 2019, and which claims the priority of application LU 100971 filed on Oct. 25, 2018, the content of which (text, drawings and claims) are incorporated here by reference in its entirety.

FIELD

The invention deals with the field of inkjet printing of functional materials on substrates. The invention, in various instances, is aimed at printing microsystems, the substrate being at least partially made of platinized silicon.

BACKGROUND

Printing functional materials, in particular functional oxides, on high surface energy materials presents particular difficulties since the ink tends to spread away on the material surface instead of sticking to the precise point where the droplet of ink has been deposited.

To counter-act the spreading of the ink, the surface to be printed is first prepared by deposition of a barrier and then the printed material is applied such that it does only spread within the boundaries of the barrier.

This first step of barrier deposition is commonly described as "templating", since it consists in the realization of a template on the substrate.

Literature proposes two main solutions to limit the spreading of the ink, i.e., hard templates which are physical barriers such as lithographically patterned molds, or soft templates which are chemical barriers such as self-assembled monolayers (SAMs). The present invention focuses on soft templates.

The deposition of soft templates is known to be achieved by photolithography such as described in document U.S. Pat. No. 8,888,253 B2. A whole surface is covered by SAMs and the area to be printed is cleaned from SAMs by a photolithography process. An alternative technology can be micro-contact printing (see H. Lee et al., *MTL Ann. Res. Rep.*, MS15, 2009), wherein a polydimethylsiloxane stamp impregnated with a fluorinated thiol solution is pressed against the substrate.

Alkanethiol self-assembled monolayers (SAMs) can bond to noble metals such as gold, platinum, copper, palladium, iridium and ruthenium. The surface-exposed hydrocarbon chain reduces surface energy and the surface becomes 'hydrophobic' or 'ink-phobic' (ink-repelling).

After the step of deposition of SAMs, the step of printing with the desired functional material is carried out. This is usually done by inkjet printing.

As a consequence, the known techniques employ two technologies, a first technology for the first step (deposition of SAM) and a second technology (i.e., inkjet printing) for the second step (deposition of ink).

Many drawbacks result from this need of two technologies. For instance, the proper positioning of the substrate in the second step which should match perfectly the first step is a difficulty. Furthermore, it lacks practicability and is time, cost and precursor consuming.

SUMMARY

The present invention aims at improving the known processes of printing functional materials on high surface energy substrates while overcoming the above-mentioned drawbacks.

The stated problem is solved by an only inkjet-printing-based process. In other words, substrate templating and material printing are both processed with the same technology. This is made possible by the development of a SAM precursor ink that is suitable for being printed by inkjet process. In this context of printing of functional materials, known SAMs do not have such properties.

This solution is cost and time efficient, and removes the need to reposition the substrate after the step of templating. As a consequence, the precision of the print is considerably improved.

The stated problem is also solved by the composition of the SAM precursor ink which is a 1-dodecanethiol in a solvent mixture of 2-methoxyethanol and glycerol. In general, alkanethiols are particularly suited for adhering to the substrate. The mixture with glycerol makes the SAM precursor ink suitable for being printed by inkjet. In particular, this solvent mixture impacts the viscosity of the SAM precursor ink which must be such that it can be contained in an inkjet cartridge and droplets of adequate size can be formed and can adhere to the substrate. Indeed, glycerol is known for its viscous properties, particularly relevant when printing by jetting droplets. During the inkjet process, the SAM precursor ink is also submitted to a temperature at which solvent vapor pressure may be high. A solvent with a too low boiling point would evaporate and would therefore not play its role. The particular composition of the SAM precursor ink according to the invention is made with a solvent with a higher boiling point that makes it suitable for being inkjet-printed.

The problem is also solved by a cartridge for a printing machine, the cartridge containing such a composition.

The invention also relates to the use of such a cartridge, alone, or as a kit with another cartridge containing the functional material, in particular to perform steps of the printing method of the invention.

The invention also relates to the product obtained by the process of the invention. As is explained below, the use of such an only inkjet-printing-based process can be identified on the final product, for instance a microsystem, which has been at least partially manufactured by the printing process.

Printing Process

According to the invention, the printing process is as prescribed in claim 1.

In an exemplary embodiment, the process comprises furthermore at least one of the following steps:
(c) drying;
(d) pyrolysis;
(e) crystallization;
and, in various instances all these steps are performed in that order, and after step (b).

These steps allow to get rid of the SAM material and to synthesize the printed functional material. When all three steps are carried out, an annealing process is achieved.

The steps of drying, pyrolysis and crystallization can be as follows: drying at 130° C. for 3 minutes, pyrolysis at 350° C. for 8 minutes and crystallization at 700° C. for 5 minutes. An optional second step of drying at about 250° C. for about 3 minutes can be applied. The temperatures and the durations of each step depend on the nature of the functional material and the thickness of the layer (i.e. density of droplets printed). The skilled person would know to which extent they can divert from these values while reaching the same effects. Also, for a given functional material, the temperature and duration can be (inversely) varied to obtain the same effects. For instance, drying at ambient temperature is possible but this requires a substantially longer duration than 3 minutes.

In various instances, the thickness of a layer of functional material is between 5 and 500 nm, preferably between 30 and 150 nm, for example from 50 to 90 nm, e.g., about 70 nm. The thickness of the layer is governed by the density of droplets printed in step (b). Layers which are thinner than 5 nm would not be continuous, since the droplets of functional material would spread discontinuously on the substrate. Layers which are thicker than 500 nm tend to crack during the drying process.

In an exemplary embodiment, steps (a) to (d) are carried out and are repeated one time or more, defining a cycle, and step (e) is performed after step (d) every n cycle, n being equal or greater than 1, preferably n=3 or n=4. Indeed, the crystallization step is not essential for each cycle. This multi-cycle or multi-layer process allows to print a thicker film of functional material.

The SAM may decompose or be degraded due to the annealing process.

There is therefore a need to re-deposit SAM at the beginning of each deposition of a new layer.

The volume of the droplets can be from 1 pL to 20 pL, preferably 10 pL or 12 pL.

The density of deposition of the functional material can be from 100 droplets/mm$^2$ to 7000 droplets/mm$^2$, in various instances a few hundreds of droplets, for example 700±50 droplets/mm$^2$.

The density of deposition of the SAM is such that the distance between two successive drops is less than 40% of the diameter of the drop once it is deposited on the substrate. This serves the purpose of preventing a "jagged edge effect" due to the superimposition of adjacent droplets. Indeed, a small distance between two successive droplets makes it possible to achieve a continuous edge.

The droplets are deposited at a rate of a few thousands of droplets per second, i.e. a rate from 1,000 to 200,000 droplets per second, in various instances 1,000 to 20,000 droplets per second, for example 1,000 drops per second.

The pattern of the template defined by the deposition of the SAM can be of any desired shape, form or size. A square-grid pattern is described in the present application as an exemplary embodiment although any other shape, can be printed like a circle or any random closed line. The order of magnitude of the template can be from 10 µm to a few cm. In that sense, the method of the invention is particularly flexible.

In a particular exemplary embodiment of the printing method, at least one of the steps of drying, pyrolysis or crystallization is carried out within the printing machine. The handling of the substrate between the printing of two successive layers is therefore avoided. To this end, the machine is equipped with heating means such as IR-heating means, laser, photonic annealing or any conventionally known heating means. The structure of the machine is such that it is suitable for resisting to such temperatures. A thermal shield to isolate the substrate or a removable oven can be provided. During these steps, the printing head with the ink is in various instances put at a distance from the substrate being heated, to prevent any risk of deterioration to the ink.

In another exemplary embodiment, the printing method does not make use of cartridges. The printing machine comprises a plurality of tanks, each containing one of the "raw" compositions: alkanethiol, glycol ether, ethylene glycol, glycerol and functional material. The raw compositions are fed to two mixing chambers at desired proportions to obtain the composition of the SAM precursor ink in one chamber and the composition of functional material ink in another chamber. These two (final) compositions are then fed to the printing head. This simplifies the re-filling of the machine by avoiding the need of frequent cartridge replacement. With such an arrangement, the machine can keep on printing and does not need to be stopped when an empty cartridge is to be replaced.

Composition of the SAM Precursor Ink

The composition used as SAM precursor ink is a thiol, in various instances an alkanethiol, for example 1-dodecanethiol, in a solvent mixture of alcohols and ethers, in various instances glycols, glycol ethers, polyols, polyol ethers, for example, 2-methoxyethanol and glycerol, and the substrate is made of high surface energy material containing at least a noble metal, in various instances a metal of the group Pt, Au, Cu, Ir, Pd, Ru.

In an exemplary embodiment, the composition is made of an alkanethiol in a solvent mixture of 2-methoxyethanol and glycerol.

The following rheological properties are important for the solvent to be "inkjetable": a viscosity within the range: 1-15 mPa·s and a surface tension within the range: 20-40 mN/m. Typical solvent mixture consist of 2-methoxyethanol and glycerol. Advantageously, the proportions of the mixture are from 60 to 90 vol % of 2-methoxyethanol, in various instances from 70 to 80 vol %, for example about 75 vol %, the complement being glycerol. These proportions give the best results in terms of aptitude to be inkjet-printed.

In an exemplary embodiment, the alkanethiol is 1-dodecanethiol $CH_3(CH_2)_{11}SH$, in various instances in a quantity of 0.1 to 0.00001 M in the solvent, in various instances 0.01 to 0.0001 M, for example 0.001 M. 1-Dodecanethiol has particularly good properties to adhere to high surface energy metals.

Other similar solvents or alkanethiols (described by the general formula RSH where R is $C_nH_{2n+1}$) can be used.

Composition of the Functional Material

Concerning the material to be deposited on the substrate, various embodiments of the invention concerns PZT ink $(Pb(Zr,Ti)O_3)$ or PZT doped with Fe, K, Nb, Ta, and/or Nd. The PZT ink consists of a standard chemical solution deposition (CSD or sol-gel) material modified with solvents.

A specific embodiment of the PZT ink can be a PZT ink that has a near-morphotropic-phase-boundary composition (MPB). A mixture of dehydrated lead(II) acetate, zirconium (IV) butoxide and titanium(IV) isopropoxide in 2-methoxyethanol with 10% excess lead is heated at reflux during two hours to ensure homogenization and stabilization of alkoxide species via ligand exchange. The resulting PZT solution is then diluted to 0.2 M with ethylene glycol and glycerol to adjust ink viscosity and surface tension for efficient droplet ejection using cartridges commercially available such as Dimatix®.

The ink should in various instances have the following rheological properties: a viscosity within the range: 1-15 mPa·s and a surface tension within the range: 20-40 mN/m. In an exemplary embodiment, the PZT ink is diluted in 65 (±5) vol % 2-methoxyethanol, 25 (±5) vol % glycerol and 10 (±5) vol % ethylene glycol.

Alternatively, the functional material can be PLZT ((Pb, La)(Zr,Ti)O$_3$), PbTiO$_3$, PbZrO$_3$, Pb(Mg,Nb,Ti)O$_3$, BaTiO$_3$, (Ba,Ca)(Ti,Zr)O$_3$ or any equivalent.

Alternatively, the functional material can be BiFeO$_3$ or (Bi,Re)FeO$_3$, where Re is rare-earth metal, such as La, Nd, Sm, Eu, etc.

The functional material can also be (Bi$_{0.5}$Na$_{0.5}$)TiO$_3$ or (Bi$_{0.5}$K$_{0.5}$)TiO$_3$ or their solid solutions as well as their solid solutions with BaTiO$_3$.

The functional material can be (K,Na)NbO$_3$, (K,Na,Li)(Sb,Ta,Nb)O$_3$ or their solid solutions with (Bi$_{0.5}$Na$_{0.5}$)TiO$_3$ and BaTiO$_3$.

The functional material can be selected from the group: (K,Na)NbO$_3$, (K,Na,Li)(Sb,Ta,Nb)O$_3$ and their solid solutions with (Bi$_{0.5}$Na$_{0.5}$)TiO$_3$ and BaTiO$_3$.

The functional material can be any of Al$_2$O$_3$, SiO$_2$, TiO$_2$, ZrO$_2$, ZnO, or ZnO, doped with Al.

The functional material can be any of the solid solutions of HfO$_2$—ZrO$_2$, CrO$_2$, VO$_2$, CuO, Fe$_2$O$_3$, Fe$_3$O$_4$, IrO$_2$, BaO, SrO, MgO, Y$_2$O$_3$, CeO$_2$, Cs$_2$O, WO$_3$, MoO$_3$, or RuO$_2$.

The functional material can be HfO$_2$ doped with: Y, Si, Sr, La, Gd, and/or Al.

The functional material can be In$_2$O$_3$ or SnO$_2$ and solid solution between the two.

Finally, the functional material can be LaNiO3 or SrRuO3.

These various embodiments of the material share common rheological properties which give them the aptitude to be ink printed.

Substrate

As for the material of the substrate, the invention aims at printing on any material with high surface energy containing at least a metal and compatible with the formation of SAMs such as materials comprising Pt, Au, Cu, Ir, Pd, Ru or any material with similar properties. This material can be deposited on silicon, glass, steel or polymer. The most preferable material for the substrate to be printed by the disclosed invention is platinized silicon.

Platinum has very high surface energy (~1 J m$^{-2}$). Due to extreme wetting, the direct deposition of functional materials by inkjet printing of organic solvent-based inks is inadequate. Other noble metals can present similar properties.

Cartridges

The invention also relates to a printing cartridge containing the templating ink, i.e. the composition aimed at being used as SAM precursor ink.

The invention also relates to a kit of at least one such cartridge and at least one cartridge containing the functional material.

The cartridges can have a capacity of 3 mL and the size of the nozzle can be of 21 μm. Other cartridges can be used according to the machine used or the size or shape of the pattern/print to be achieved.

The cartridge for the template ink and the cartridge for the functional material ink can be identical. They can also be different. Indeed, a bigger cartridge can be used for the functional material, such that, for instance, the replacement of the two cartridges can occur simultaneously.

The printing method of an exemplary embodiment of the invention can make use of more than two cartridges. For instance, there can be more than one cartridge of one particular material for consumption reasons, to avoid any maintenance when depositing a high volume of material.

Alternatively or complementarily, there can also be more than two materials involved. For instance, when depositing several layers, two successive layers of functional material or two successive layers of SAM can be made of different materials. There are therefore at least three cartridges comprising three different compositions. The kit of the invention can include these at least three cartridges.

This technique makes it possible to print superior layers of electrodes. These printed top electrodes can be made of Ag, Cu, Pt or ITO (indium tin oxide). All these materials are known to be printable.

Product

The particular but not exhaustive applications of the printing process of the invention are microsystems, passive capacitors, silicon wafers or integrated piezoelectric devices. For instance, the method of the invention can be used to print a series of piezoelectric actuators spaced from each other of 50 microns.

The invention also relates to the final product resulting from the printing process. Analyses have shown that the final product can have similar electrical properties as a microsystem obtained by the known methods. Secondary ion mass spectrometry (SIMS) analysis shows however that a product directly obtained by the method of the invention exhibits traces of sulfur in the functional material film. The presence of sulfur was detected across the whole thickness of a crystallized PZT film. A higher concentration of sulfur was however found at the edge of the printed PZT pattern. It could be ascribed to the diffusion of thiols in the functional material film, due to the coexistence of both inks in the liquid state after printing. The templating lines contain a relatively large amount of residual solvent and non-grafted thiols that can diffuse in the liquid film of functional material. Thiols used for substrate templating are the only possible source of sulfur since they are the only sulfur-containing species used in the whole process.

As a consequence, by performing a SIMS analysis on a product, one can identify whether a particular product has been produced by the printing method of the invention.

DRAWINGS

Figure 5:
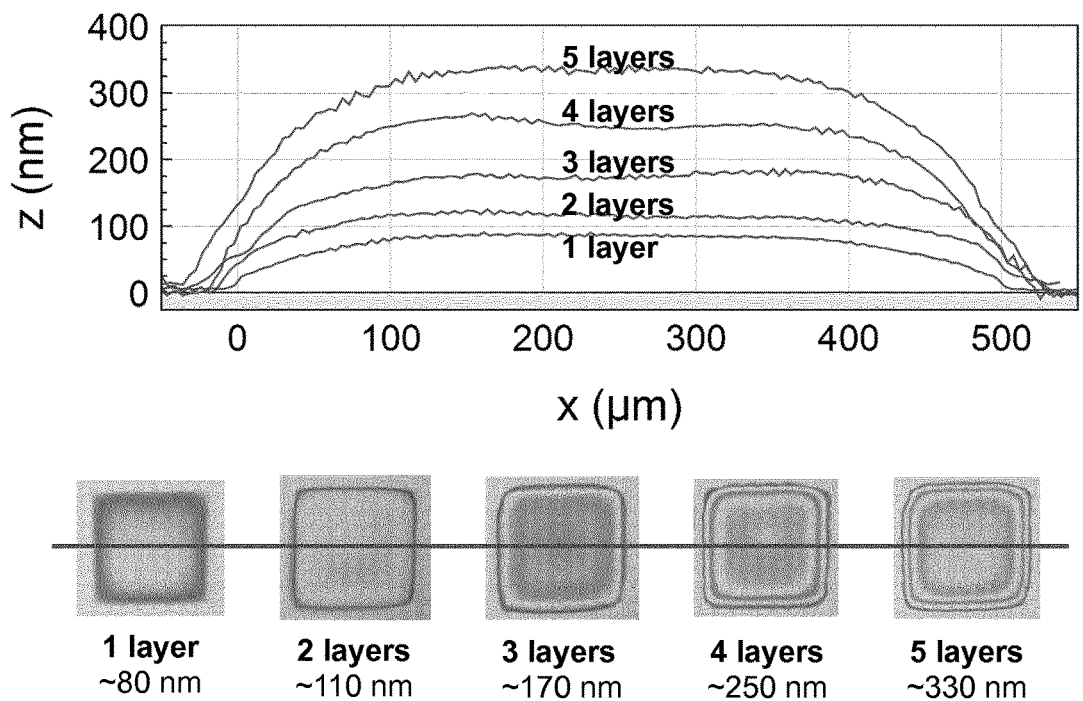

FIG. 5 exemplarily shows the thickness of the deposition, in accordance with various embodiments of the invention.

Figure 6:
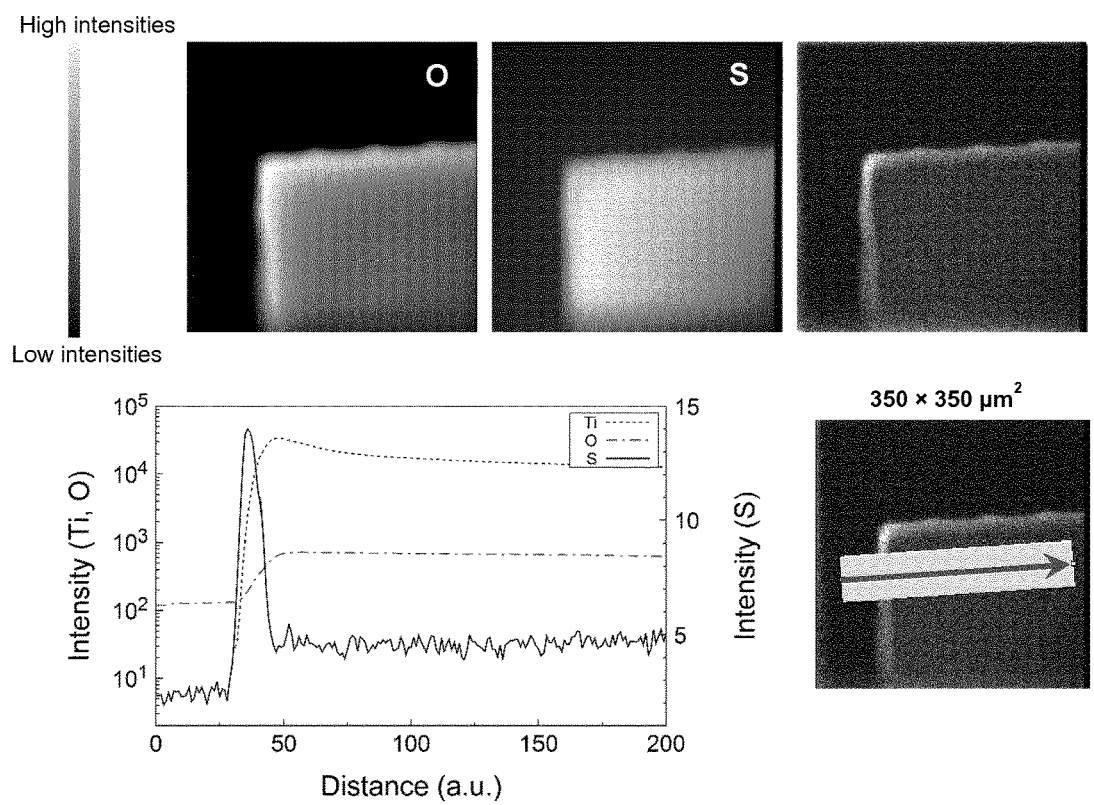

FIG. 6 exemplarily shows the results of a SIMS analysis, in accordance with various embodiments of the invention.

DETAILED DESCRIPTION

Figure 1:
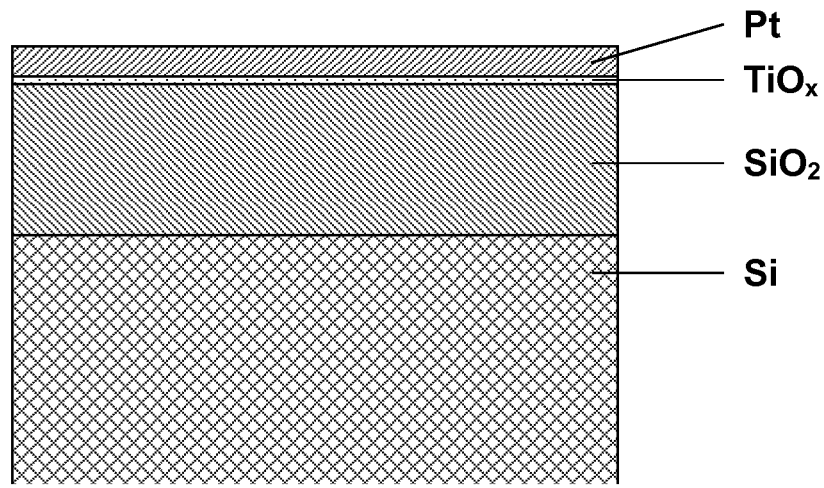
FIG. 1 is an exemplary illustration of a cross section of a substrate, in accordance with various embodiments of the invention.

FIG. 1 shows a cross section (not to scale) of a substrate that can be used for the printing process of the invention. The substrate in various instances comprises a silicon base with a platinum coating.

Figure 2:
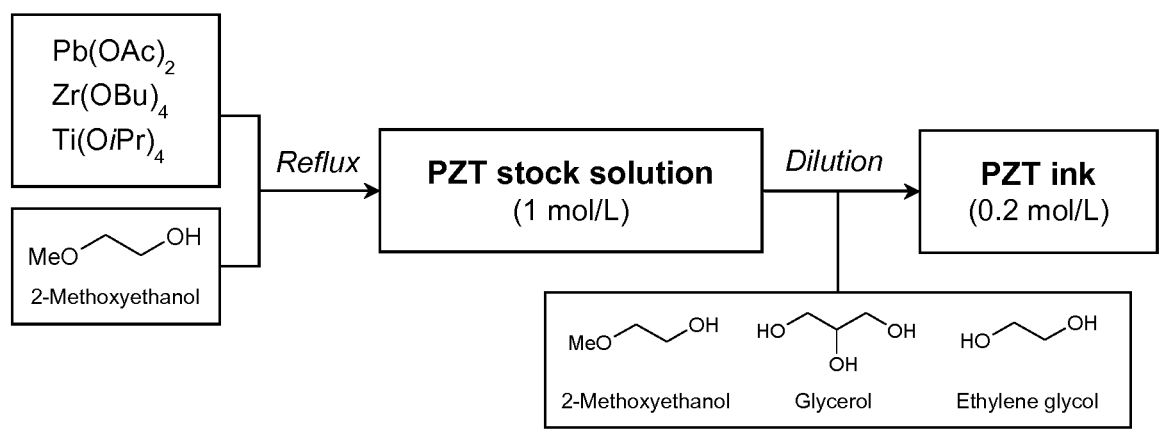
FIG. 2 is an exemplary diagram summarizing the preparation of a functional material, in accordance with various embodiments of the invention.

FIG. 2 details the process employed to obtain a functional material. In this example, PZT ink is obtained after reflux and dilution.

A mixture of dehydrated lead(II) acetate, zirconium(IV) butoxide and titanium(IV) isopropoxide in 2-methoxyethanol with 10% excess lead is heated at reflux during two hours to ensure homogenization and stabilization of alkoxide species via ligand exchange. The resulting PZT sol is then diluted to 0.2 M with ethylene glycol and glycerol to adjust ink viscosity and surface tension for efficient droplet ejection. For instance, the PZT can be diluted in 65 vol % 2-methoxyethanol, 25 vol % glycerol and 10 vol % ethylene glycol.

Other equivalent processes can be used to obtain the various compositions of ink discussed above.

Figure 3:
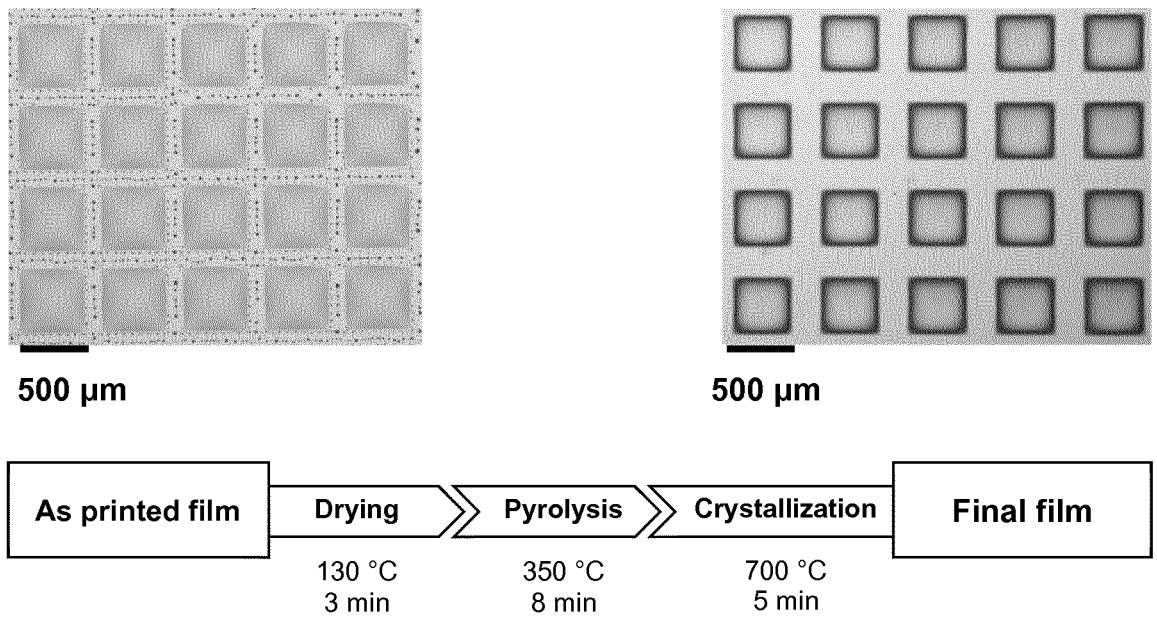
FIG. 3 illustrates an exemplary embodiment of the printing method, in accordance with various embodiments of the invention.

FIG. 3 shows an example of pattern/template and a particular printing process according to an embodiment of the invention. A grid-like pattern is printed with SAMs (step (a) of the printing process). In practice, a first series of parallel lines is printed and then a second series of parallel lines perpendicular to the first series is printed. Then the functional material is printed within the boundaries of the grid-like pattern (step (b) of the printing process).

In a particular example, the steps of drying, pyrolysis and crystallization are applied to obtain a final (dry) film on the substrate, as illustrated on the right side of FIG. 3.

In a particular example of a product obtained by the invention, the two-step full-inkjet-printing process has been used to fabricate an array of 500×500 µm² PZT squares. The obtained 80 nm-thick structures are crystallized in perovskite phase.

Figure 4:
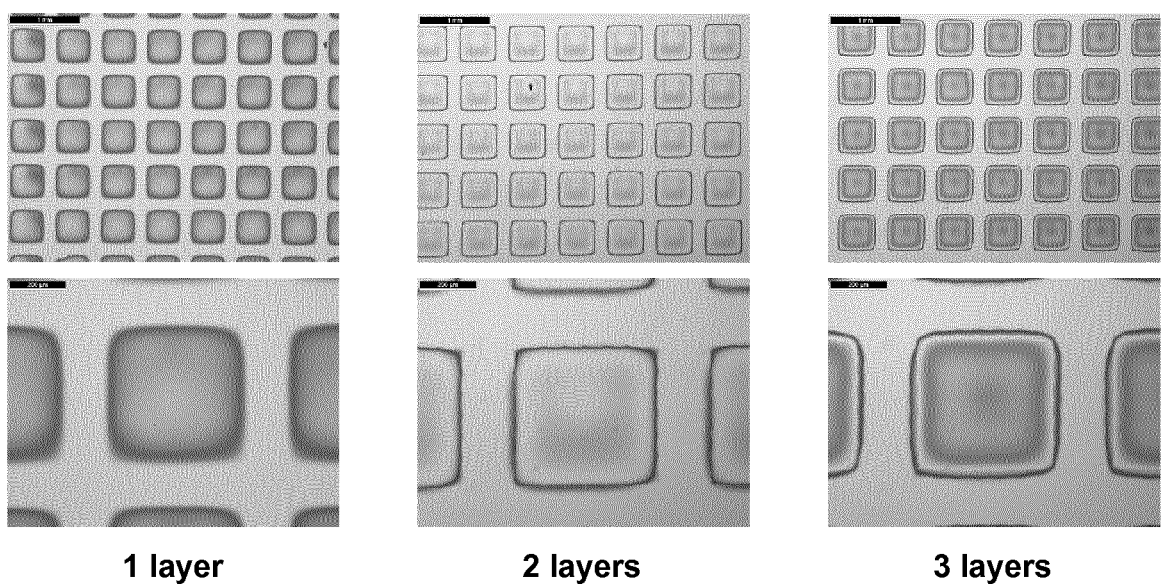
FIG. 4 illustrates exemplary top view pictures of the printed pattern of films, in accordance with various embodiments of the invention.

FIG. 4 shows pictures taken with an optical microscope of the films that can be obtained after multi-layer printing process. The printing steps of FIG. 3 are repeated. They are carried out in the same area of the substrate to build one layer at a time. This means that a precise repositioning of the printing head relative to the substrate for each new layer is performed.

FIG. 5 shows the thickness profile of one of the squares. The measurement of the thickness was made after crystallization of each of the successive layers and prior to printing the next layer. We can see regular thickness along the transverse direction of the square. We can also see that the method of the invention allows a precise positioning of the layers one onto each other. Of course, by varying the density of droplets from one layer to another layer, or varying the functional material, a wide variety of heterogenous products can be printed.

FIG. 6 shows the results of the SIMS analysis (imaging mode) of a film realized with the printing method of the invention. An elemental mapping of titanium, oxygen and sulfur was performed in the edge area of a printed PZT square. Sulfur was mostly detected at the edge of the PZT square.

Both the functional material and the SAM precursor inks were liquid and were in contact with each other during the printing process. The sulfur detected in the layer of functional material can only originate from thiols that have diffused into the functional material precursor ink while both were in liquid state. Such diffused sulfur is not observed when SAMs are deposited by any other method because in these known methods, the liquid functional material ink is only printed once the SAM is formed and there is no residual liquid on the substrate.

Although the printing process, the composition of the SAM, the composition of the functional material, the substrate material and the cartridges have been described in details in separate paragraphs of the description, it has to be noted that each particular embodiment of one of these elements is combinable with each particular embodiment of another one of these elements.

The invention claimed is:

1. An inkjet printing process on a substrate comprising
   (a) a step of deposition of a self-assembled monolayer (SAM) on the substrate;
   (b) a step of printing of a material within the boundaries of the SAM, the material being a composition containing at least one of the following:
      at least one of PZT doped with either Fe, K, Nb, Ta, and Nd;
      $BiFeO_3$ or $(Bi,Re)FeO_3$, where Re is rare-earth metal comprising at least one of La, Nd, Sm, Eu, etc.;
      $(Bi_{0.5}Na_{0.5})TiO_3$ or $(Bi_{0.5}K_{0.5})TiO_3$ and their solid solutions as well as their solid solutions with $BaTiO_3$;
      $(K,Na)NbO_3$ or $(K,Na,Li)(Sb,Ta,Nb)O_3$ and their solid solutions with $(Bi_{0.5}Na_{0.5})TiO_3$ and $BaTiO_3$;
      at least one of $Al_2O_3$, $SiO_2$, $TiO_2$, $ZrO_2$, $ZnO$, or $ZnO$, doped with Al;
      at least one of solid solutions of $HfO_2$—$ZrO_2$, $CrO_2$, $VO_2$, $CuO$, $Fe_2O_3$, $Fe_3O_4$, $IrO_2$, $BaO$, $SrO$, $MgO$, $Y_2O_3$, $CeO_2$, $Cs_2O$, $WO_3$, $MoO_3$, or $RuO_2$;
      $HfO_2$ doped with at least one of Y, Si, Sr, La, Gd, and Al;
      at least one of $In_2O_3$ or $SnO_2$ or any solid solution between $In_2O_3$ and $SnO_2$; and
      at least one of $LaNiO_3$ or $SrRuO_3$,
   wherein both steps (a) and (b) are made by inkjet printing.

2. The printing process according to claim 1, wherein the SAM ink is a composition made of a thiol in a solvent mixture of alcohols and ethers, and the substrate is made of a high surface energy material containing at least a noble metal.

3. The printing process according to claim 2, wherein the solvent mixture of the SAM ink is made of 60 to 90 vol % of 2-methoxyethanol.

4. The printing process according to claim 2 wherein the thiol is 1-dodecanethiol in a quantity of 0.01 to 0.0001 M.

5. The printing process according to claim 1 wherein said material is diluted to 0.2 M with a solvent made of 65 (±5) vol % 2-methoxyethanol, 25 (±5) vol % glycerol and 10 (±5) vol % ethylene glycol.

6. The printing process according to claim 1 wherein the process further comprises at least one of the following steps:
   (c) drying;
   (d) pyrolysis; and
   (e) crystallization.

7. The printing process according to claim 6, wherein the steps (a) to (d) are carried out in that order and are repeated one time or more, defining a cycle, and step (e) is performed after step (d) every n cycle, n being equal or greater than 1, such that a multi-layer functional material is printed on the substrate.

8. The printing process according to claim 1, wherein at least one of the SAM and the material have the following rheological properties: a viscosity within the range 1-15 mPa·s and a surface tension within the range 20-40 mN/m.

9. A kit, said kit comprising:
   at least one cartridge for a printing machine containing a composition made of 1-dodecanethiol in a solvent mixture of 2-methoxyethanol and glycerol; and
   at least one cartridge comprising a composition containing at least one of the following:
      at least one of PZT doped with either Fe, K, Nb, Ta, and Nd;
      $BiFeO_3$ or $(Bi,Re)FeO_3$, where Re is rare-earth metal comprising at least one of La, Nd, Sm, Eu, etc.;
      $(Bi_{0.5}Na_{0.5})TiO_3$ or $(Bi_{0.5}K_{0.5})TiO_3$ and their solid solutions as well as their solid solutions with $BaTiO_3$;

(K,Na)NbO$_3$ or (K,Na,Li)(Sb,Ta,Nb)O$_3$ and their solid solutions with (Bi$_{0.5}$Na$_{0.5}$)TiO$_3$ and BaTiO$_3$;

at least one of Al$_2$O$_3$, SiO$_2$, TiO$_2$, ZrO$_2$, ZnO, or ZnO, doped with Al;

at least one of solid solutions of HfO$_2$—ZrO$_2$, CrO$_2$, VO$_2$, CuO, Fe$_2$O$_3$, Fe$_3$O$_4$, IrO$_2$, BaO, SrO, MgO, Y$_2$O$_3$, CeO$_2$, Cs$_2$O, WO$_3$, MoO$_3$, or RuO$_2$;

HfO$_2$ doped with at least one of Y, Si, Sr, La, Gd, and Al;

at least one of In$_2$O$_3$ or SnO$_2$ or any solid solution between In$_2$O$_3$ and SnO$_2$; and at least one of LaNiO$_3$ or SrRuO$_3$.

10. The printing process according to claim 1 further comprising preforming the process using a cartridge for a printing machine containing a composition made of 1-dodecanethiol in a solvent mixture of 2-methoxyethanol and glycerol.

11. The printing process according to claim 2, wherein the thiol is 1-dodecanethiol, the solvent mixture of alcohols and ethers is 2-methoxyethanol and glycerol, and the noble metal of the substrate is taken from the group: Pt, Au, Cu, Ir, Pd, Ru.

12. The printing process according to claim 2 wherein the thiol is 1-dodecanethiol in a quantity of 0.001 M in the solvent.

\* \* \* \* \*